(12) United States Patent
Sani et al.

(10) Patent No.: US 6,794,914 B2
(45) Date of Patent: Sep. 21, 2004

(54) NON-VOLATILE MULTI-THRESHOLD CMOS LATCH WITH LEAKAGE CONTROL

(75) Inventors: Mehdi Hamidi Sani, San Diego, CA (US); Gregory A. Uvieghara, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 158 days.

(21) Appl. No.: 10/155,378

(22) Filed: May 24, 2002

(65) Prior Publication Data

US 2003/0218231 A1 Nov. 27, 2003

(51) Int. Cl.[7] .................. H03K 3/289; H03K 3/356
(52) U.S. Cl. .................................. 327/202; 327/203
(58) Field of Search ................. 327/199, 200–203, 327/208–212, 218; 326/40, 46

(56) References Cited

U.S. PATENT DOCUMENTS

| | | | | |
|---|---|---|---|---|
| 5,982,211 | A | * 11/1999 | Ko ........................... | 327/202 |
| 6,246,265 | B1 | * 6/2001 | Ogawa ..................... | 326/95 |
| 6,304,123 | B1 | * 10/2001 | Bosshart .................. | 327/212 |
| 6,310,491 | B1 | * 10/2001 | Ogawa ..................... | 326/46 |
| 6,538,471 | B1 | * 3/2003 | Stan et al. ............... | 326/46 |
| 6,566,927 | B2 | * 5/2003 | Park et al. ............... | 327/211 |
| 2002/0080663 | A1 | * 6/2002 | Kameyama et al. | |

OTHER PUBLICATIONS

1–V Power Supply High–Speed Digital Circuit Technology with Multithreshold–Voltage CMOS: IEEE Journal of Solid–State Circuits. vol. 30:8 (1995).
SSCC96. Session 10/Low Power & Communication Signal Processing. Paper FA 10.4.
A 1–V High–Speed MTCMOS Circuit Scheme for Power-Down Application Circuits: IEEE Journal of Solid–State Circuits. vol. 32:6 (1997).

* cited by examiner

Primary Examiner—Tuan T. Lam
(74) Attorney, Agent, or Firm—Philip R. Wadsworth; Charles D. Brown; Timothy F. Loomis (57) ABSTRACT

An integrated circuit including a Multi-Threshold CMOS (MTCMOS) latch combining low voltage threshold CMOS circuits with high voltage threshold CMOS circuits. The low voltage threshold circuits including a majority of the circuits in the signal path of the latch to ensure high performance of the latch. The latch further including high voltage threshold circuits to eliminate leakage paths from the low voltage threshold circuits when the latch is in a sleep mode. A single-phase latch and a two-phase latch are provided. Each of the latches is implemented with master and slave registers. Data is held in either the master register or the slave register depending on the phase or phases of the clock signals. A multiplexer may alternatively be implemented prior to the master latch for controlling an input signal path during sleep and active modes of the latch and for providing a second input signal path for test.

24 Claims, 9 Drawing Sheets

NON-VOLATILE MULTI-THRESHOLD CMOS LATCH WITH LEAKAGE CONTROL

BACKGROUND

1. Field

The invention relates to the field of Complementary Metal Oxide Semiconductor (CMOS) integrated circuits. More particularly, the invention relates to Multi-Threshold CMOS circuits and devices capable of operating in active and sleep modes.

2. Description

Modern Integrated Circuits (IC's) are designed to provide an enormous amount of functionality in a small area. Very large scale IC's are able to provide nearly all the functions required in many electronic devices. The ability to incorporate vast processing power and multiple functions has made IC's nearly indispensable in portable electronic devices. Portable electronic devices, such as notebook computers, personal digital assistants, and cellular phones require IC's that have the ability to perform highly complex tasks. Portable electronic device designers, in turn, are committed to increasing the functionality of the device, while reducing its physical size.

One method of increasing the functionality of a portable electronic device is to increase the number of functions performed by the IC's. However, in order to keep the size of the IC from becoming prohibitively large, IC designers have been decreasing the physical size of the transistors used in the circuit design. The dimensions of the transistors used in a typical IC are limited by the techniques used to create them. Presently, IC transistors have dimensions on the order of sub-microns. For example, in sub-micron IC technology, the length (L) of a Metal Oxide Semiconductor (MOS) transistor may be less than 1 $\mu$m.

The physical size of portable electronic devices cannot be decreased merely by incorporating more functionality into the IC's. Increases in the complexity and functionality of the IC scales the power consumption of the IC proportionally. Because most portable electronic devices are battery powered, power consumption plays an important part in determining the useful operational time of a portable device. Increasing the capacity of the battery may increase the operational time of a portable device, however, this option is in conflict with the desire to decrease the physical size and weight of portable devices. Thus, there is a corresponding need to reduce the power consumed in the portable electronic device. Decreasing the power consumption allows the designer to incorporate a battery having smaller capacity, and typically smaller physical size.

Electronic devices may further conserve power by implementing sleep modes in some or all of the circuits within the device. For example, a paging device may sleep during defined time periods and only monitor paging messages during an assigned time slot. Similarly, a mobile telephone may control portions of the phone to enter sleep mode while the phone is powered on but is not in the process of communicating. The electronic devices would typically alternate between sleep and active modes per the needs of the device. It may be appreciated that nearly all portable electronic devices incorporate a sleep mode. For example, paging devices, telephones, notebook computers, wireless communication devices, personal digital assistants, and other electronic devices may include sleep modes where at least a portion of the circuits are put into a reduced power consumption mode.

The IC designer is thus tasked with increasing the complexity of the IC while simultaneously decreasing the power consumption. One manner of decreasing the power consumed by the IC is by judicious selection of the type of technology used in implementing the IC. An IC may be implemented using a variety of technologies. For example, circuits may be implemented using bipolar transistors, Metal Oxide Semiconductor (MOS) transistors, NMOS transistors, and Complementary MOS (CMOS) transistors. CMOS transistor implementations are particularly favored in digital designs because a CMOS gate, theoretically, consumes no power in a static state.

Figure 1:
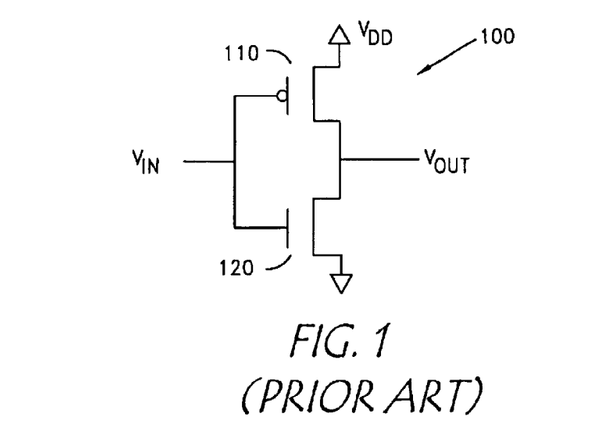
FIG. 1 is a functional diagram of a prior art CMOS inverter.

A diagram of a typical CMOS inverter 100 is shown in FIG. 1. CMOS technology uses both n-channel and p-channel circuits in the same chip. The source of an n-channel MOS transistor 120 is connected to a voltage return, which may also be referred to as a voltage common, voltage reference, voltage return, or a ground. It may be appreciated that the voltage return may also be one of the power supply lines. The voltage return provides the reference for a corresponding power supply line, Vdd. The voltage return may be isolated from other circuits or may be common to the voltage return used in other circuits. The gate of the n-channel MOS transistor 120 is electrically connected to the gate of a p-channel MOS transistor 110. The common gate connection also serves as the input to the CMOS inverter 100. The source of the p-channel MOS transistor 110 is electrically connected to the power supply line, Vdd. The drain of the p-channel circuit 110 is electrically connected to the drain of the n-channel circuit 120. The common drain connection is the output of the inverter 100.

The operation of the inverter 100 is relatively simple. When the input signal, Vin, is low, the n-channel transistor 120 does not conduct, or is cut-off. However, the p-channel circuit 110 is switched on such that the power supply voltage, Vdd, appears at the output, Vout, of the inverter 100. Alternatively, when the input signal, Vin, is high, the p-channel transistor 110 does not conduct and the n-channel circuit 120 is switched on, such that the output of the inverter 100 is pulled to voltage return. For each of the two states of the inverter 100, one transistor of the complementary transistor pair is non-conducting. The non-conducting transistor provides a high impedance path from the power supply line to voltage return, thus limiting the power dissipation of the inverter 100 when the output is static. The leakage current of the cut-off transistor largely determines the level of power dissipation in the static state.

Power is consumed by the CMOS inverter 100, and CMOS circuits in general, when the circuit switches between logic states. The power dissipation of the inverter 100 is proportional to the amount of energy provided to a load capacitance at each level transition. Thus, the power dissipation of the CMOS inverter 100 is proportional to $C_L*Vdd^2*f$. The value $C_L$ represents the load capacitance, Vdd represents the power supply voltage, and f represents the rate of change of the data.

It may be appreciated that for clocked sequential circuits, power dissipation is proportional to the clock frequency. Although the clock frequency depends largely on data throughput requirements, the clock signal to a number of circuits may be halted during periods in which the circuit is not required to be active. These periods of inactivity may include sleep modes where a portion of an IC is powered down to further conserve power. Largely, the rate of the clock signal cannot be slowed to save power without adversely affecting processing capability.

Perhaps the greatest improvements in CMOS power consumption can be made by reducing the power supply voltage. As indicated by the formula listed above, power dissipation is proportional to the square of the power supply voltage, Vdd. Thus, reductions in the power supply voltage provide greater power savings over comparable reductions in the operating frequency or the load capacitance.

However, reducing the power supply voltage adversely affects the propagation delay of CMOS circuits. As the power supply voltage is reduced to the threshold voltage of the MOS transistor, Vth, the propagation delay increases. The increase in propagation delay greatly degrades the ability of the CMOS gate to function in a high speed circuit.

One manner of decreasing the propagation delay, and thereby increasing the ability of the gate to function in a high speed circuit, is to reduce the threshold voltage, Vth, of the MOS transistors. However, a decrease in the threshold voltage results in an increase in the sub-threshold leakage current of the MOS transistor. The result is an increase in the static current, and thus the power dissipation during static periods.

Power consumption of CMOS circuits, can also be reduced without greatly degrading the high speed characteristics of the circuit by implementing both high threshold voltage transistors along with low threshold voltage transistors onto the same IC design. These circuits are referred to as Multi-Threshold CMOS (MTCMOS) circuits.

Previous MTCMOS implementations have connected the low threshold voltage circuits to virtual power supply lines and virtual voltage common lines. The virtual power supply and voltage common lines are electrically connected to the actual power supply or voltage common lines using high threshold voltage power transistors. During active modes the high threshold voltage power transistors are conducting and connect the low threshold voltage transistors to the actual power supply line and the actual voltage common line. During sleep modes, the high threshold voltage power transistors are disconnected. The virtual power supply lines are effectively shut off, thus shutting down all of the low threshold voltage transistors connected to the virtual power supply lines.

An adverse effect of shutting down all of the low threshold transistors is that all of the states of the low threshold voltage CMOS circuits are lost. In some situations, the loss of all data in the low threshold voltage circuits is not a problem. These situations are those in which the circuit will reacquire all states upon returning to the active mode. However, in other situations, entry into a sleep mode requires the data to be held in some or all of the sleeping circuits. As an example, it may be desirable that upon return to the active state, the circuit resumes operation from the state existing at the time the circuit transitioned to the sleep mode. Resumption of circuit operation is not possible when the low threshold voltage circuits lose all of the circuit states in the sleep mode.

Thus, what is needed is a circuit that operates with a low voltage power supply and has the low propagation delay of low threshold voltage circuits during an active mode, but still maintains its state during a sleep mode. Furthermore, the circuit should not require any additional circuits to store the state when transitioned to a sleep mode. The circuit should have the low leakage characteristics of a high threshold voltage circuit such that static power consumption is minimized. In the active mode, the circuit should have the high speed characteristics of the low threshold voltage CMOS circuits, and in the sleep mode, the circuit should have the non-volatility and low leakage current of the high voltage threshold circuits.

SUMMARY

A Multi-Threshold CMOS (MTCMOS) latch is disclosed that has low threshold voltage circuits in the majority, if not all, of the circuits in the signal path of the latch to ensure high performance of the latch. The latch further includes high voltage threshold circuits to eliminate leakage paths through the low threshold voltage circuits when the latch is in a sleep mode. The high threshold voltage circuits are placed such that the leakage path through a low threshold voltage circuit is in series with the leakage path through a high threshold voltage circuit. Thus, high threshold voltage circuits characterize the leakage current of the latch.

A single-phase latch and a two-phase latch are disclosed. However, the invention is not limited to only these designs. Each of the latches is preferably implemented with master and slave registers. Data is held in either a master register or a slave register depending on the phase or phases of the clock signals. A multiplexer may be implemented prior to the master latch for providing additional input signals and to provide for design-for-testability.

In one embodiment, the MTCMOS latch includes a first transmission gate, a CMOS master register having an input electrically connected to the output of the first transmission gate, a second transmission gate electrically connected to an output of the CMOS master register, and a second transmission gate electrically connected to an output of the CMOS master register, and a slave register having an input electrically connected to an output of the second transmission gate. The second transmission gate comprises low threshold voltage CMOS transistors.

The sleep mode may occur during any clock phase in a single-phase latch. The placement of the low threshold voltage (LVT) circuits may be optimized for the specific clock phase during which sleep mode occurs. Similarly, in a two-phase latch, the LVT circuits may be placed to optimize signal throughput during an active mode while maintaining data non-volatility and low current leakage during sleep mode.

BRIEF DESCRIPTION OF THE DRAWINGS

The features, objects, and advantages of the invention will become more apparent from the detailed description set forth below when taken in conjunction with the drawings in which like reference characters identify correspondingly throughout and wherein.

DETAILED DESCRIPTION

The following disclosure describes a number of latch embodiments that are implemented in MTCMOS such that they are capable of operation using low power supply voltages, such as 1 Volt. The disclosed latches provide the high speed performance of a latch that is implemented entirely using low threshold voltage CMOS, while maintaining the low leakage characteristics of a latch implemented using solely with high threshold voltage CMOS circuits. The disclosed latches are capable of being implemented using deep sub-micron (for example L<=0.18 μm) technology. It may be appreciated that a latch designed in accordance with the invention may be incorporated into an IC, where an IC may refer to an Application Specific Integrated Circuit (ASIC), processor, programmable logic device, memory, or other circuit.

It may also be appreciated that a latch designed in accordance with the invention may be used in a device such as a mobile phone, pager, personal digital assistant, notebook computer, or any other electronic device that may benefit from a high performance, low voltage latch that has low leakage and non-volatile data storage in sleep mode. For example, the latch may be incorporated in a communication device having a radio frequency frontend coupled to a baseband processor. The latch may be incorporated as part of the RF frontend or as part of the baseband processor. The baseband processor may also include a processor, Digital Signal Processor, memory, and other circuits. The communication device may be a wireless phone, pager, radio, or some other device.

Figure 2:
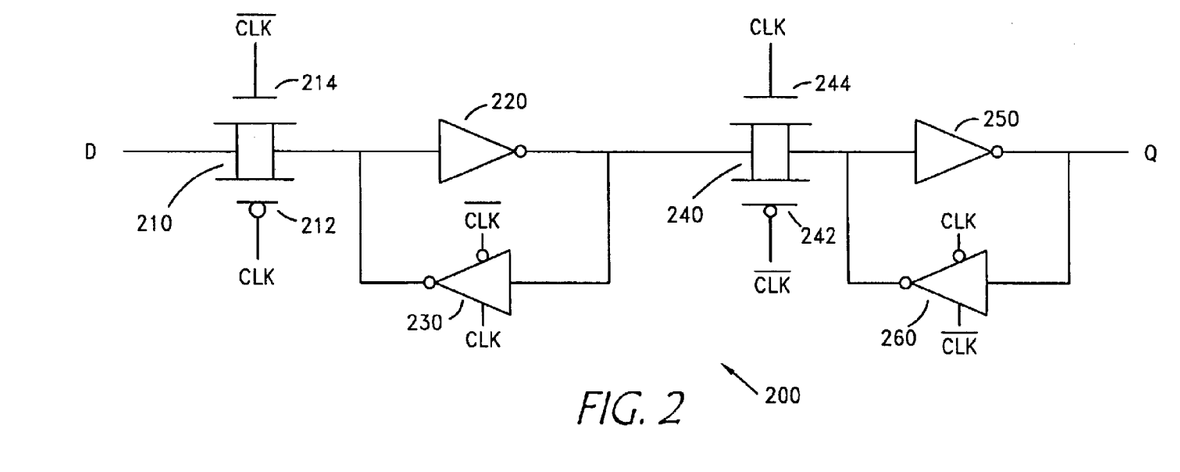
FIG. 2 is a functional diagram of a master-slave register.

FIG. 2 shows a functional block diagram of an embodiment of an MTCMOS latch 200 implementation. Throughout the figures, low threshold voltage circuits are shown having a hatched input or a hatched portion between the source and drain, while high threshold voltage circuits are shown without any hatching. An input signal is provided to a first transmission gate 210, which is constructed of a p-channel circuit 212 and an n-channel circuit 214. A transmission gate, e.g. 210, alternatively referred to as access transistors, comprises an n-channel circuit, e.g. 214, and a p-channel circuit, e.g. 212, connected in parallel and controlled by inverted gate voltages. If the gate voltage of the n-channel circuit 214 is low, the p-channel circuit 212 has a corresponding gate voltage at or near the power supply voltage and both circuits are non-conducting. On the other hand, if the gate voltage of the n-channel circuit 214 is at or near the power supply voltage and the gate voltage of the p-channel circuit 212 is low, both circuits are conducting. If the source voltage is near the power supply voltage, Vdd, there is a voltage drop across the n-channel circuit 214 but almost no voltage drop across the p-channel circuit 212.

The first transmission gate 210 is on, or active, when the CLK signal is in a low state. When the first transmission gate 210 is active, the input signal is thus coupled to the input of a first inverter 220. The output of the first inverter is electrically connected to the input of a first feedback inverter 230. The output of the first feedback inverter 230 is, in turn, electrically connected back to the input of the first inverter 220.

The output of the first inverter 220 is electrically connected to a second transmission gate 240. The second transmission gate 240 is constructed of a p-channel circuit 242 and an n-channel circuit 244. As was the case with the first transmission gate 210, the circuits of the second transmission gate 240 are controlled by the CLK signal. However, the second transmission gate 244 is configured to be active in the opposite phase of the CLK signal used to activate the first transmission gate 210. While the CLK signal is provided to the p-channel circuit 212 of the first transmission gate 210, the /CLK signal, or inverted clock signal, is provided to the p-channel circuit 242 of the second transmission gate 240. Similarly, the /CLK signal is provided to the n-channel circuit 214 of the first transmission gate 210, and the CLK signal is provided to the n-channel circuit 244 of the second transmission gate 240. The actual phase of the CLK signal where the first transmission gate 210 is active may be either phase of the CLK signal depending on the signals provided to the p-channel and n-channel circuits. The second transmission gate 240 is typically configured to be active during the CLK phase wherein the first transmission gate 210 is not active.

The output of the transmission gate 240 is electrically connected to the input of a second inverter 250. The output of the second inverter 250 is the output of the latch 200. The output of the second inverter 250 is also electrically connected to the input of a second feedback inverter 260. The output of the second feedback inverter 260 is electrically connected to the input of the second inverter 250.

The operation of the latch 200 may be described as follows. A logic signal is provided to the input of the first transmission gate 210. During a first CLK phase or state, the first transmission gate 210 is active, and the input signal drives the input of the first inverter 220. If need be, the output of the first inverter 220 transitions to reflect the inverse of the input signal. The first feedback inverter 230 is inactive during the clock phase that the first transmission gate 210 is active. Thus, while the first transmission gate 210 is active, the output of the first inverter 220 continually provides the inverse of the input signal.

At the transition of the CLK from a first phase to a second phase or state, the first transmission gate 210 becomes inactive and the second transmission gate 240 becomes active. The first feedback inverter 230 is activated and feeds back an inverted version of the first inverter 220 output to the input of the first inverter 220. Thus, the signal is latched in a master register. The signal level maintained in the master register, composed of the first inverter 220 and the first feedback inverter 230, is provided to the second inverter 250 and to the latch 200 output. The slave register, composed of the second inverter 250 and the second feedback inverter 260, maintain the level at the output of the latch 200 until a subsequent clock cycle. The second feedback inverter 260 is inactive during the phase of the CLK signal that the second transmission gate 240 is active. The second feedback inverter 260 becomes active when the CLK signal transitions back to the phase for which the second transmission gate 260 is inactive. The signal, or data bit, is latched in the slave register while the second feedback inverter 260 is active.

Thus, it may be appreciated that embodiments of the MTCMOS latch 200 configuration may have low threshold voltage circuits in only the signal path and may have high threshold voltage circuits in the feedback and non-critical paths of the latch. For example, in FIG. 2, the feedback inverters, 230 and 260, may be implemented entirely as high threshold voltage circuits while the inverters in the direct signal path, 220 and 250, as well as the transmission gates, 210 and 240, may be implemented using low threshold voltage circuits. Alternatively, some of the circuits in the direct signal path may be low threshold voltage circuits while others are high threshold voltage circuits. The high threshold voltage circuits may be placed such that they provide a low current leakage path for the low threshold voltage circuits.

Figure 3:
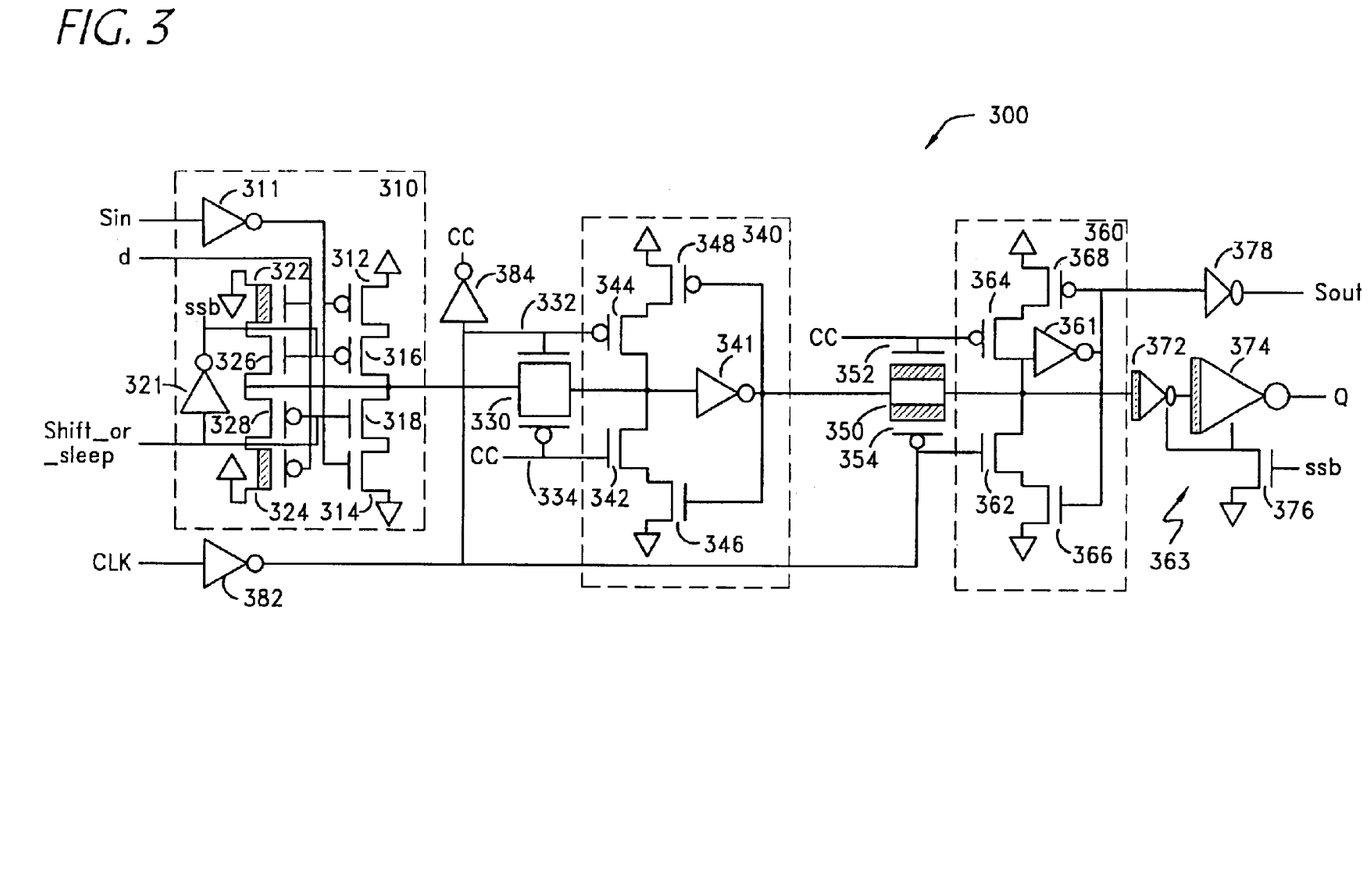
FIG. 3 is a block diagram of a single-phase MTCMOS latch.

FIG. 3 shows a detailed block diagram of one embodiment of a single-phase MTCMOS latch 300. The latch 300 comprises four main functional blocks, a scan-mux 310, a master register 340, a slave register 360, and an output buffer 363. The scan-mux 310, also referred to as a mux or multiplexer, is coupled to the input of the master register 340 using a first transmission gate 330. The output of the master register 340 is coupled to the input of the slave register 360 using a second transmission gate 350. The output of the slave register 360 is electronically connected to the buffer 363 before being provided as the output of the latch 300.

The scan-mux 310 may be included as part of the latch 300 design but need not be included in all latch 300 designs. The scan-mux 310 is used for testability functions during the fabrication and test of the IC. A scan input, Sin, is provided through which the scan test signals are provided. A data input, d, is also provided by the scan-mux 310. Under normal operating conditions of the latch 300, only the data input d of the scan-mux 310 is used. Although the scan input is typically not used during normal operation, the latch 300 typically includes the scan-mux 310 because of the importance of IC testing and verification.

The scan-mux 310 also provides a control signal input, here labeled Shift_or_sleep. The control signal input is used to select which of the mux inputs will be electrically connected to the scan-mux 310 output. For the scan-mux 310 configuration shown in FIG. 3, the signal that is provided to the Sin input is electrically connected to the scan-mux 310 output when the Shift_or_sleep control signal is at a high level. The signal that is provided to the d input is electrically connected to the scan-mux 310 output when the Shift_or_sleep control signal is at a low level. It may be appreciated that the scan-mux 310 may be configured such that the phase of the control signal is inverted. Additionally, it may be appreciated that the scan-mux 310 may incorporate more than two inputs and that a digital control word may be applied to the multiplexer to control the selection of input signals.

The d input of the scan-mux 310 is electrically connected to the gate of a first low threshold voltage (LVT) n-channel circuit 322 and the gate of a first LVT p-channel circuit 324. The source of the first n-channel circuit 322 is electrically connected to voltage common and the source of the first LVT p-channel circuit 324 is electrically connected to a power supply line. The drain of the first LVT n-channel circuit 322 is electrically connected to the source of a first high threshold voltage (HVT) n-channel circuit 326. Similarly, the drain of the first LVT p-channel circuit 324 is electrically connected to the source of a first HVT p-channel circuit 328. The drains of the first HVT n-channel circuit 326 and the first HVT p-channel circuit 328 are electrically connected, and are electrically connected to the output of the scan-mux 310.

The Sin input of the scan-mux 310 is similarly connected except that no LVT circuits are used. The Sin input of the scan-mux 310 is buffered and inverted in a signal inverter 311 before being electrically connected to the gates of second HVT n-channel and p-channel circuits, 314 and 312, which have their sources connected to voltage common and power supply line, respectively. The drains of the second HVT n-channel and p-channel circuits, 314 and 312, are electrically connected, respectively, to the sources of third HVT n-channel and p-channel circuits, 318 and 316. The drains of the third HVT n-channel and p-channel circuits, 318 and 316, are electrically connected together and are also electrically connected to the output of the scan-mux 310.

Selection of the d input or the Sin input is determined based on the signals applied to the gates of the first HVT circuits, 326 and 328, and the third HVT circuits, 318 and 316. The control input to the scan-mux 310 is electrically connected to the gate of the first HVT p-channel circuit 328 and the gate of the third HVT n-channel circuit 318. The control input is also electrically connected to a control inverter 321, which logically inverts the control input signal. The output of the control inverter 321 is electrically connected to the gates of the first HVT n-channel circuit 326 and the third HVT p-channel circuit 316.

Thus, when the control input signal is low, the first HVT n-channel and p-channel circuits, 326 and 328, are biased on. The d input signal propagates through the first LVT n-channel and p-channel circuits, 322 and 324, and through the biased on first HVT n-channel and p-channel circuits, 326 and 328, to the output of the scan-mux 310. The low control input signal cuts off the third HVT n-channel and p-channel circuits, 318 and 316, and thus, the Sin input is isolated from the scan-mux 310 output.

Conversely, when the control input signal is high, the third HVT n-channel and p-channel circuits, 318 and 316, are biased on. The Sin input signal propagates through the second HVT n-channel and p-channel circuits, 314 and 312, and through the biased on third HVT n-channel and p-channel circuits, 318 and 316, to the output of the scan-mux 310. The high control input signal cuts off the first HVT n-channel and p-channel circuits, 326 and 328, and thus, the d input is isolated from the scan-mux 310 output.

The output of the scan-mux 310 is electrically connected to the first transmission gate 330. The first transmission gate 330 comprises an n-channel and a p-channel circuit, 332 and 334. In the configuration shown in FIG. 3, the first transmission gate 330 is constructed of HVT circuits. The first transmission gate 330 conducts when a high level is applied to the gate of the n-channel circuit 332 and a low level is applied to the gate of the p-channel circuit 334.

The output of the first transmission gate 330 is electrically connected to the input of a master register 340 (MR). The input of the master register 340 is electrically connected to a master register (MR) inverter 341. The input of the MR 340 is also electrically connected to the drains of first MR n-channel and p-channel circuits, 342 and 344. The output of the MR inverter 341 is electrically connected to the output of the master register 340. The output of the MR inverter 341 is electrically coupled to the gates of second MR n-channel and p-channel circuits, 346 and 348. The source of the second MR p-channel circuit 348 is electrically connected to the power supply line while the source of the second MR n-channel circuit 346 is electrically connected to voltage common. The drain of the second MR p-channel circuit 348 is electrically connected to the source of the first MR p-channel circuit 344. Similarly, the drain of the second MR n-channel circuit 346 is electrically connected to the source of the first MR n-channel circuit 342. Thus it may be appreciated that the first and second MR n-channel circuits, 342 and 346, are configured in series, and the first and second MR p-channel circuits, 344 and 348, are configured in series.

The output of the master register 340 is electrically connected to a second transmission gate 350 comprising n-channel and p-channel circuits, 352 and 354. In the embodiment shown in FIG. 3, the circuits used in the second transmission gate 350 are LVT circuits. The output of the second transmission gate 350 is electrically connected to the input of the slave register 360 (SR).

The input of the slave register 360 is electrically connected directly to the primary output of the slave register 360. The input of the slave register 360 (SR) is also connected to the drains of first SR n-channel and p-channel circuits, 362 and 364, as well as to the input of a SR inverter 361. The output of the SR inverter 361 is electrically connected to the gates of second SR p-channel and n-channel circuits, 368 and 366. The output of the SR inverter 361 is also electrically connected to a second output of the SR 360.

The source of the second SR p-channel circuit 368 is electrically connected to a power supply line and the drain of the second SR p-channel circuit 368 is electrically connected to the source of the first SR p-channel circuit 364. Thus, it may be appreciated that the first and second SR p-channel circuits, 364 and 368, are configured in series. Similarly, the source of the second SR n-channel circuit 366 is electrically connected to voltage common, and the drain of the second SR n-channel circuit 366 is electrically connected to the source of the first SR n-channel circuit 362. The first and second SR n-channel circuits, 362 and 366 are configured in series.

The primary output of the SR 360 is electrically connected to the input of the output buffer 363. The output buffer 363 comprises a first inverter 372 having an input electrically connected to the buffer input and an output electrically connected to the input of a second inverter 374. The output of the second inverter 374 is the output of the buffer 363 and is also the output of the latch 300. The first and second buffers, 372 and 374, are LVT circuits and use an n-channel footswitch 376 to electrically connect a virtual voltage common of the first and second inverters, 372 and 374, to an actual voltage common. The gate of the footswitch 376 is electrically connected to the inverted control input, designated "ssb", of the scan-mux 310. Alternatively, a p-channel headswitch may be used to electrically connect a virtual power supply line of the first and second inverters, 372 and 374, to an actual voltage supply line. However, because of circuit speed and sizing differences between n-channel and p-channel circuits, an n-channel footswitch may be preferable. If additional isolation is desired, both a footswitch and a headswitch may be used to connect virtual power supply lines of the buffer components to actual power supply lines.

A single clock is used to control the transmission gates, 330 and 350, and master and slave registers, 340 and 360. The input clock signal (CLK) is provided to the input of a first clock inverter 382. The first clock inverter 382 may be used to buffer the input clock signal in addition to inverting the signal. The output of the first clock inverter 382 is electrically connected to the n-channel circuit 332 of the first transmission gate 330, the p-channel circuit 354 of the second transmission gate 350, the first MR p-channel circuit 344, the first SR n-channel circuit 362, and the input of a second clock inverter 384. The output of the second clock inverter 384 is electrically connected to the p-channel circuit 334 of the first transmission gate 330, the n-channel circuit 352 of the second transmission gate 350, the first MR n-channel circuit 342, and the first SR p-channel circuit 364. Thus, it may be appreciated that the first and second transmission gates, 330 and 350, conduct on opposite phases of the clock signal. Additionally, the first MR circuits, 344 and 342, conduct on the opposite phase of the clock signal that controls conduction of the first SR circuits, 364 and 362.

Alternatively, the single phase latch 300 shown in FIG. 3 may be modified to operate as a two-phase latch. In order to reconfigure the single phase latch 300 to a two-phase latch, the configurations of the CLK line and the first and second clock inverters, 382 and 384, are modified. The modifications are not shown in FIG. 3, but are described as follows. The clk signal and connections to the clock inverters, 382 and 384, are removed from FIG. 3. Instead, a first phase signal, phi1 (not shown), is electrically connected to the n-channel circuit 332 of the first transmission gate 330. An inverted version of the first phase signal, phi1, may be produced by logically inverting the first phase signal using the first clock inverter 382. The inverted first phase signal is electrically connected to the p-channel circuit 334 of the first transmission gate 330. A second phase signal, phi2 (not shown), is electrically connected to the n-channel circuit 352 of the second transmission gate 350. An inverted version of the second phase signal may be produced using the second clock inverter 384. The inverted second phase signal is electrically connected to the p-channel circuit 354 of the second transmission gate 350. The first and second phase signals may, but need not be, active during mutually exclusive periods of time. Thus, it may be appreciated that the single phase latch 300 may be modified to operate as a two-phase latch.

Returning to the description of the single phase latch 300 shown in FIG. 3, the operation of the latch 300 may be described as follows. During an active state, the Shift_or_sleep control signal is low. The low control signal causes the footswitch 376 to be active, thus enabling the buffer. The low control signal also selects the d input of the scan-mux 310. During a first phase of the clock, when CLK is low, the output of the first clock inverter 382 is high, thus the first transmission gate 330 is active and the second transmission gate 350 is inactive. When the CLK signal transitions from low to high, the data value is latched in the master register 340 by cutting off the first transmission gate 330 and activating the first MR circuits, 344 and 342. The use of LVT circuits in the d-signal path of the scan-mux 310 reduces the set up time of the latch 300.

It may be appreciated that the first and second transmission gates, 330 and 350, may be configured to operate on other phases of the CLK signal by the addition of another CLK signal inverter. The actual phase of the CLK signal used by the latch does not limit the invention. Only one phase configuration is described for the sake of brevity.

The second transmission gate 350 becomes active when the CLK signal transitions from low to high. The data value latched in the MR 340 is coupled through the second transmission gate 350, slave register 360, and buffer 363 to the latch 300 output. LVT circuits are used in the second transmission gate 350, 352 and 354, as well as in the buffer 363 to reduce the clock-to-Q time of the latch 300. Thus, during the active mode, the latch 300 setup time is reduced by the incorporation of LVT circuits in the d-signal path of the scan-mux 310. The latch 300 clock-to-Q time is reduced by the incorporation of LVT circuits in the second transmission gate 350 as well as the output buffer.

Operation of the single-phase latch 300 in the scan, or test, operation does not require high speed. Thus, the Sin input path of the scan-mux 310 preferably does not implement any LVT circuits. It may be noted that the scan operation is used typically during test and is not typically used during normal operation of the latch. Rather, during normal operation when the Shift_or_sleep signal is high, the latch 300 is in a sleep mode. Because the footswitch 376 of the output buffer is disabled during sleep mode, an alternative output path is required for test and verification. This alternative output is provided by the output inverter 378, which comprises HVT circuits. Because test and verification is typically not performed at full speed, the output inverter 378 does not need to be implemented using LVT circuits.

Figure 4:
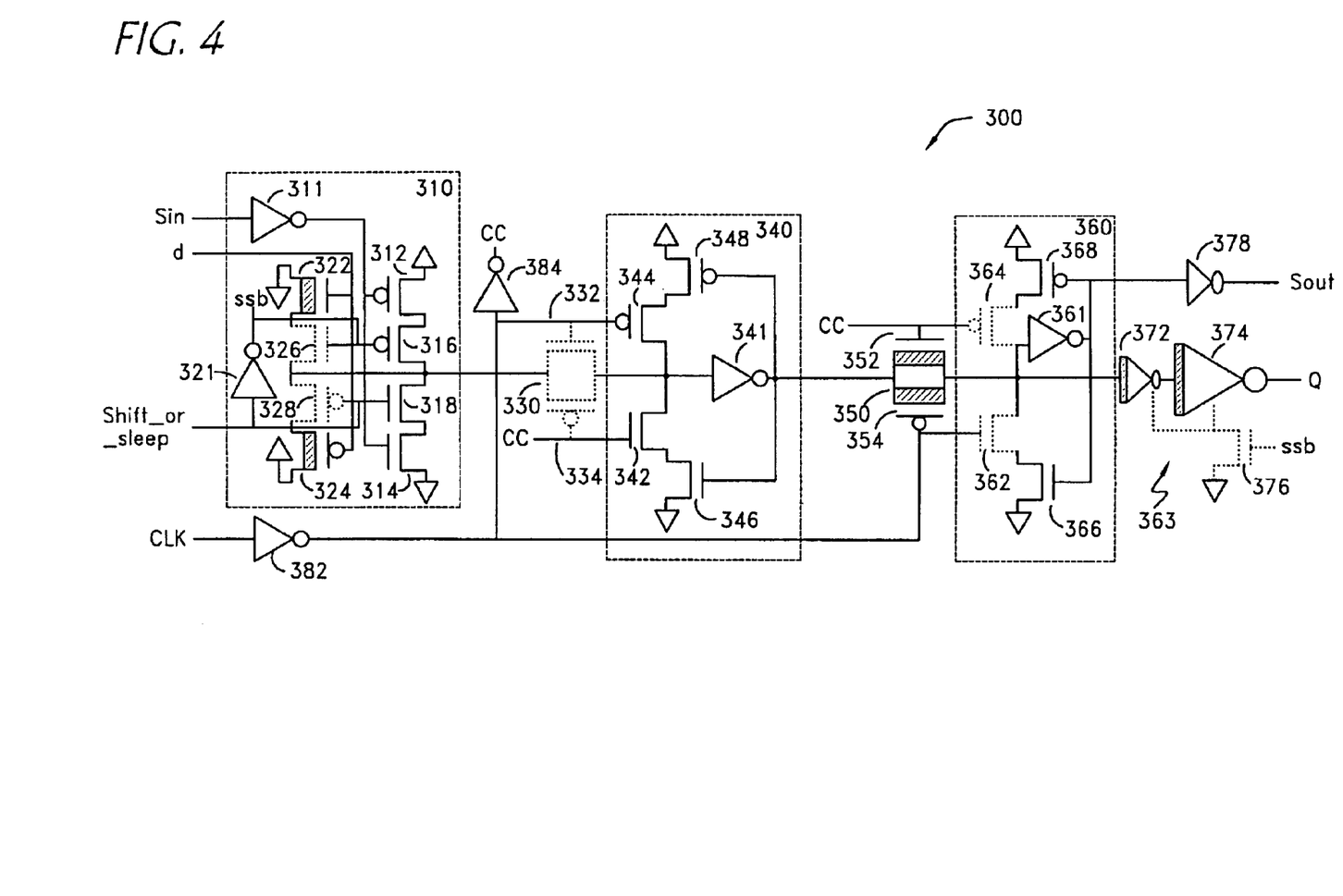
FIG. 4 is a block diagram of a single-phase MTCMOS latch during sleep mode with the clock signal high.

Non-volatility of the latch in a sleep mode is illustrated in FIG. 4, where sleep occurs with the CLK signal in a high state. During the sleep mode, the clock does not transition states. Although the sleep mode may occur asynchronously, without regard to the phase of the CLK signal, circuit designs often provide for transition to the sleep mode synchronized to a specific phase of the clock. The latch design shown in FIG. 3 will store the data regardless of the state of the clock in the sleep mode. However, the latch 300 design shown in FIG. 3 is optimized for use in circuit designs where the sleep mode occurs with the clock signal high.

The Shift_or_sleep control signal transitions from low to high at, or prior to, the transition to sleep mode. Thus, during sleep mode, the d input to the scan-mux 310 is no longer selected and it is the Sin input that is selected by the latch. Additionally, when the Shift_or_sleep signal is high, the footswitch 376 for the buffer is cutoff, thus, the buffer is powered down.

The circuits that are inactive in when the CLK signal is high are shown in FIG. 4 with a dotted outline. Because the clock state is high in the sleep mode, the first transmission gate 330 is inactive, but the first MR circuits, 344 and 342, are biased on, thereby holding the data value in the master register 340. It may be appreciated that at the transition back to active mode, the footswitch 376 conducts, and the value stored in the master register 340 immediately appears at the output of the latch 300.

Figure 5:
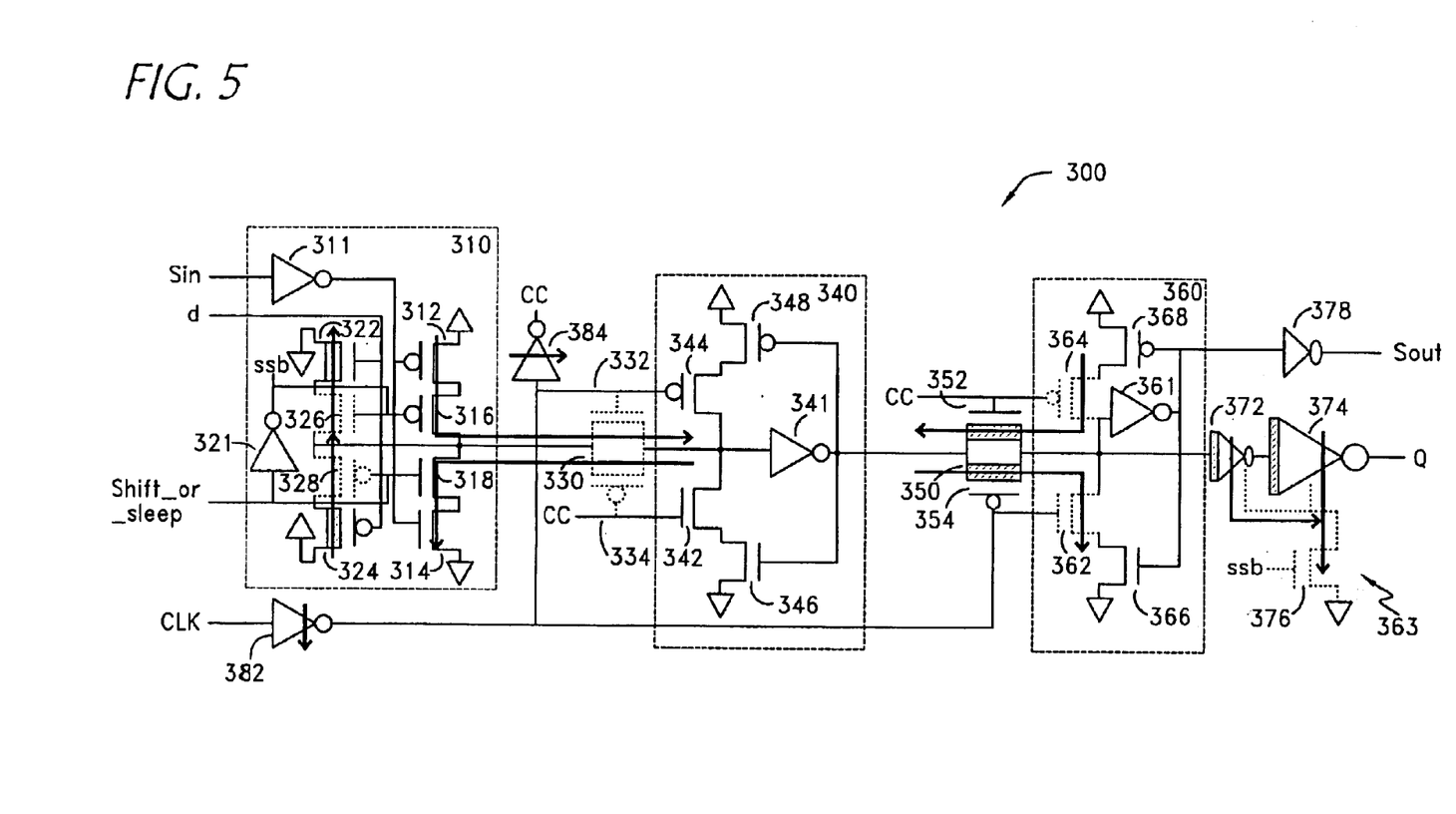
FIG. 5 is a block diagram of the leakage paths of a single-phase MTCMOS latch during sleep mode with the clock signal high.

The leakage paths of the latch 300 that are optimized for operation during sleep mode occurring in a high clock state are shown in FIG. 5. The scan-mux 310 is controlled to select the Sin input. The leakage paths through the circuits of the d input are from the power supply line through the LVT p-channel circuit 324, first HVT p-channel circuit 328, first HVT n-channel circuit 326, and LVT n-channel circuit 322 to voltage common. Thus, it may be appreciated that the leakage path occurs through all four circuits in series. Recall that the leakage through a cut off LVT circuit is much higher than the leakage through a cut off HVT circuit. The HVT circuits have the more desirable low leakage characteristics. The leakage through the circuits of the d input of the scan-mux 310 are limited by the leakage of the HVT circuits because the circuits are configured in series. Thus, the leakage through the d input circuits of the scan-mux 310 are minimized by the series configuration of the non-conducting HVT circuits.

The circuits in the Sin input are selected when the Shift_or_sleep signal is high. Thus, the leakage path from the output of the scan-mux 310 needs to be examined. If the n-channel circuits, 318 and 314, of the Sin input are conducting, the possible leakage path occurs from the output of the scan-mux 310 through the n-channel circuits, 318 and 314, to voltage return. Conversely, if the p-channel circuits, 312 and 316, are conducting, the leakage path occurs from the power supply line, through the p-channel circuits, 312 and 316, to the scan-mux 310 output. However, the output of the scan-mux 310 is only connected to the first transmission gate 330, which is cut off because the CLK signal is high. All leakage through the scan-mux 310 output is limited by the first transmission gate 330, which comprises HVT circuits, 332 and 334.

The master register 340 is active and stores the data in the clock high sleep mode. Thus, there are no leakage paths associated with the master register 340. However, the slave register 360 must be analyzed for potential leakage paths. A leakage path exists from the power supply line through the second SR p-channel circuit 368, through the first SR p-channel circuit 364, to the SR input. Similarly, a leakage path exists from the input of the SR through the first SR n-channel circuit 362, through the second SR n-channel circuit 366, to voltage return. The first SR n-channel and p-channel circuits, 362 and 364, are inactive. Thus, the first SR p-channel and n-channel circuits, 364 and 362, which are low leakage HVT circuits, limit the leakage through the SR 360.

Leakage through the sleeping buffer is limited by the HVT footswitch 376. Similarly, leakage through each of the clock inverters, 382 and 384, is limited because they comprise HVT circuits.

Thus, it may be seen that an MTCMOS latch 300 may be constructed to have low set up and clock-to-Q times when operating in the active mode. The same MTCMOS latch 300 configuration will have low leakage when in the sleep mode. When optimized to sleep with the clock phase high, the data is stored in the master register 340 during the sleep mode.

Figure 6:
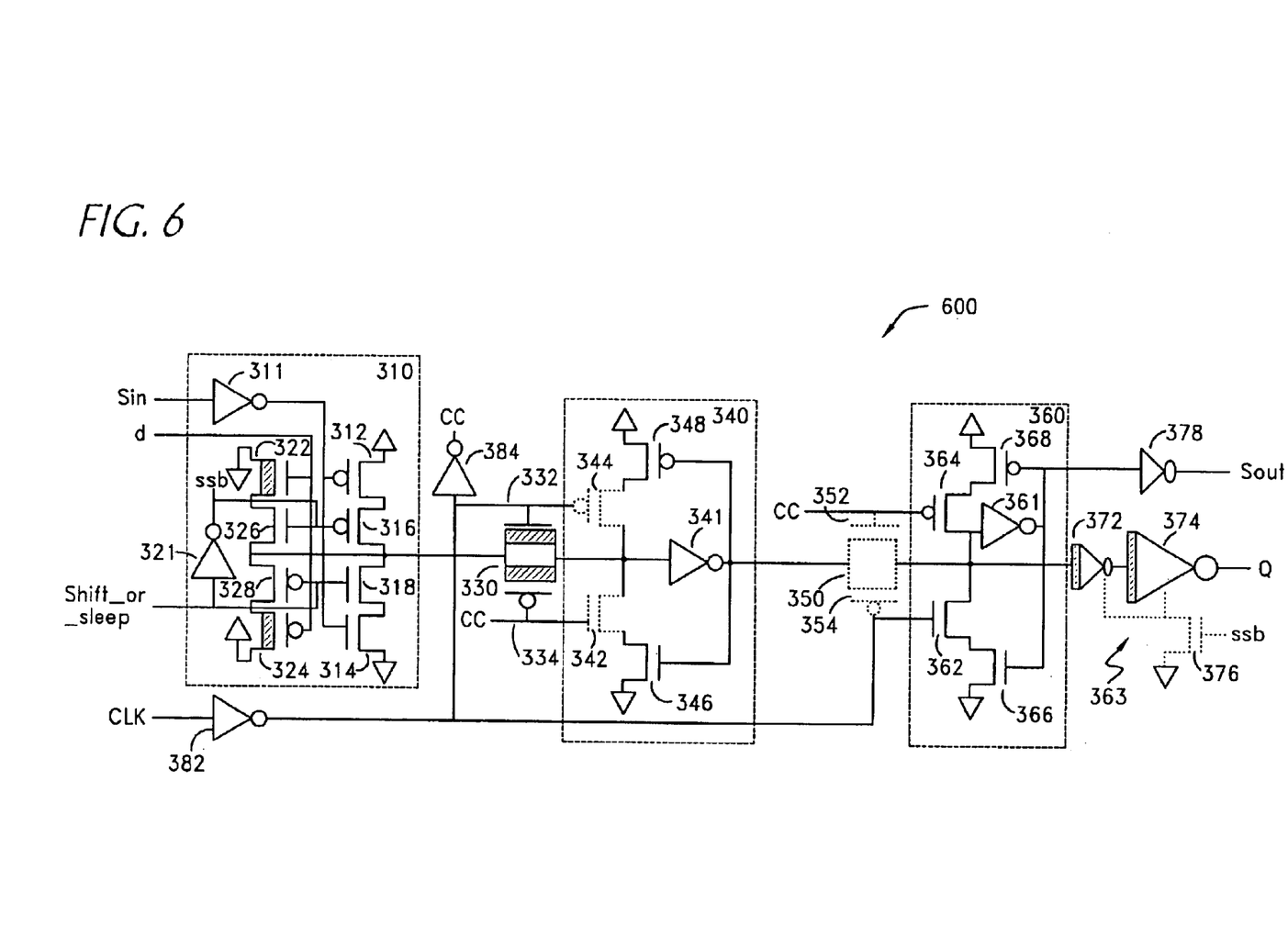
FIG. 6 is a block diagram of a single-phase MTCMOS latch during sleep mode with the clock signal low.

Another embodiment of an MTCMOS latch 600 is shown in FIG. 6. The MTCMOS latch 600 shown in FIG. 6 is optimized for use in circuits that sleep when the clock is low. The connection of the elements in the MTCMOS latch 600 of FIG. 6 is identical to that of the latch 300 shown in FIG. 3. The configuration of the scan-mux 310, master register 340, and slave register 360 are identical in the two latch designs, 300 and 600. However, to optimize the latch 600 for operation in a circuit where the sleep mode occurs with the clock phase low, the first transmission gate 330 comprises LVT circuits instead of HVT circuits, and the second transmission gate 350 comprises HVT circuits instead of LVT circuits.

The operation of the latch 600 is similar to the previously described latch 300. With the Shift_or_sleep signal low, the d-input of the scan-mux 310 is selected. The data is passed to the master register 340 during the period of time that the CLK signal is low. At the rising edge of the CLK signal, the first transmission gate 330 is cut off and the data is stored in the master register 340. At the transition of the CLK signal from low to high, the second transmission gate 350 conducts and the data signal passes from the master register 340 through the slave register 360 and the buffer to the output of the latch 600. When the CLK signal transitions back to the low state, the second transmission gate 350 is cut off and the slave register 360 stores the last state. The master register 340 receives the next data state as described above.

Storing the data in the slave register 360 ensures non-volatility of the data signal. If the latch 600 transitions to a sleep mode during a low CLK signal, the Shift_or_sleep signal transitions to the high state, thereby selecting the Sin input rather than the d input. The first transmission gate 330 is conducting because the CLK signal is in the low state. The second transmission gate 350 is cut off because the CL K signal is in the low state. The SR feedback circuits, 364 and 362, conduct such that the data value is stored in the SR. The footswitch 376 for the buffer is cut off, thereby powering down the inverters, 372 and 374 of the buffer 363. Powering down the buffer conserves power while isolating the slave register 360 data from the output of the latch 600. When the Shift_or_sleep signal transitions back to the low state, indicating the return to active state, the footswitch 376 conducts, the inverters 372 and 374 are powered on, and the latch 600 output immediately outputs the data stored in the slave register 360.

Figure 7:
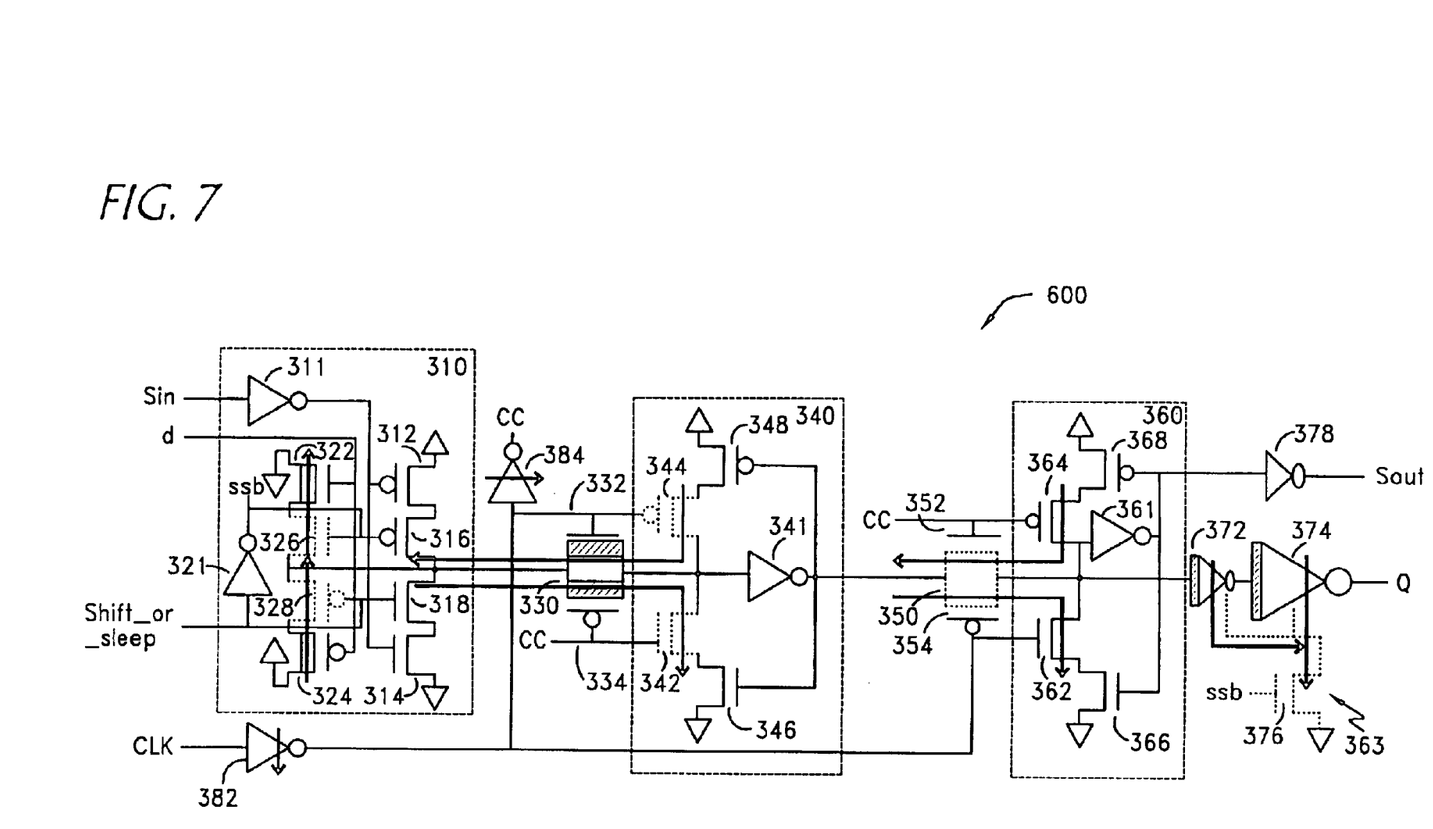
FIG. 7 is a block diagram of leakage paths of a single-phase MTCMOS latch during sleep mode with the clock signal low.

The leakage paths of the latch 600 in the sleep mode are shown in FIG. 7. The leakage path through the d input circuits of the scan-mux 310 are minimized for the same reasons discussed with respect to the latch 300 of FIG. 3. The leakage path through the p-channel circuits, 312 and 316, to the output of the scan-mux 310, through the first transmission gate 330, and through the n-channel circuits of the master register 340 are limited by the cut off HVT first n-channel circuit 342 in the master register 340. Because the first n-channel circuit 342 is a HVT circuit, the leakage is low for any leakage path having the circuit in series. Similarly, there exists a leakage path from the second p-channel circuit 348 through the first p-channel circuit 344, and through the first transmission gate 330, through the n-channel circuits, 318 and 314, of the scan-mux 310 to voltage common. However, the first p-channel circuit 344 in the master register 340 is in series with the leakage path. The first p-channel circuit 344 is constructed as a HVT circuit having low leakage. Thus, any leakage through the leakage path having the circuit in series is low.

The leakage path through the input of the slave register 360 is also low due to the configuration of the second transmission gate 350. The second transmission gate 350 is cut off during a sleep mode having a CLK signal at a low state. By constructing the second transmission gate 350 with HVT circuits, 352 and 354, the leakage is low for any leakage path having a series path through the second transmission gate 350.

The leakage paths through the buffer and the CLK inverters are low for the same reasons detailed in the discussion above relating to the latch 300 optimized for sleeping in the high CLK state.

Figure 8:
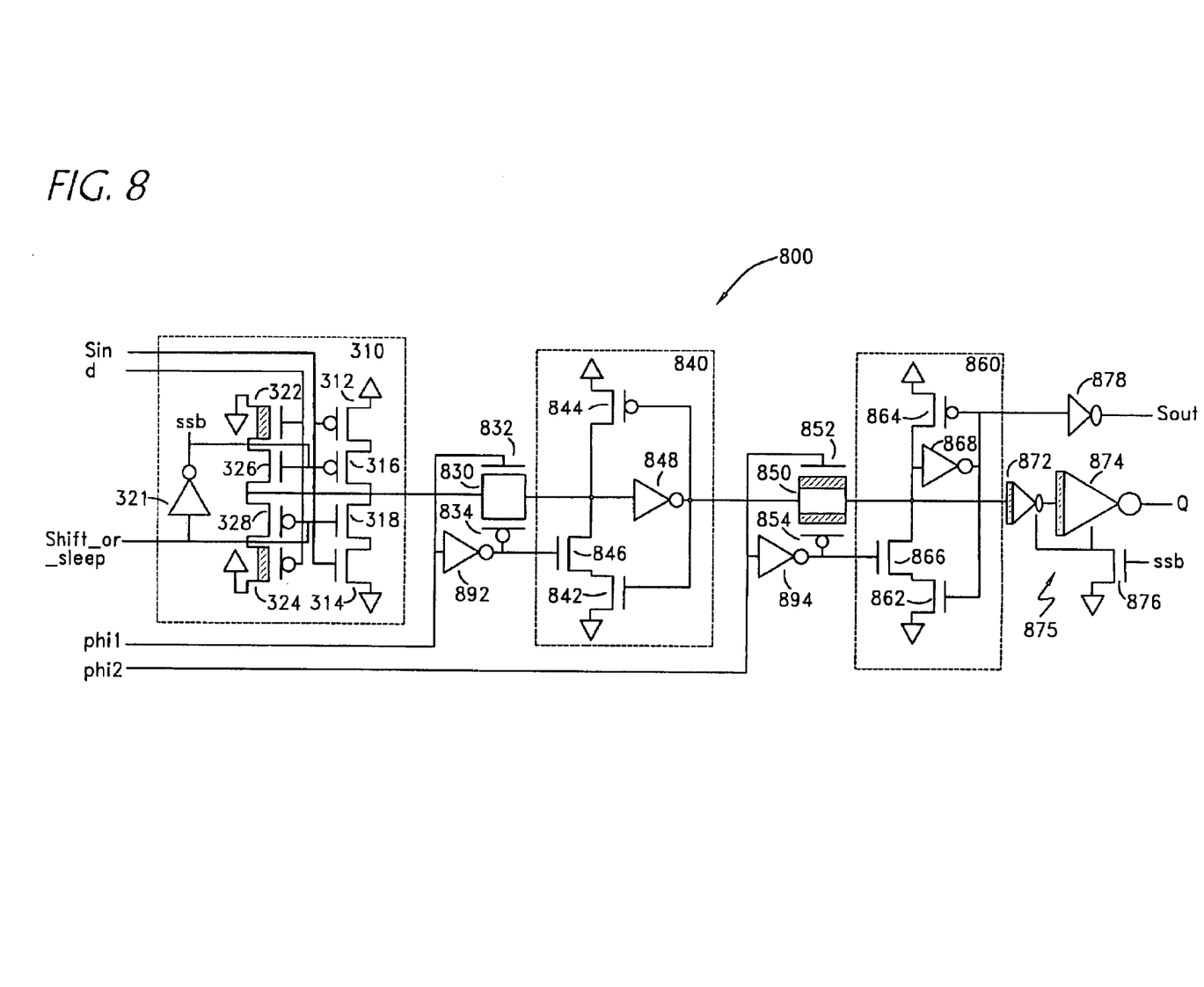
FIG. 8 is a block diagram of a two-phase MTCMOS latch during active mode.

Another latch 800 embodiment is shown in FIG. 8. The latch 800 is referred to as a two-phase latch because two control signals having different phases, phi1 and phi2, are used to control the master register 840 and slave register 860, respectively.

The two-phase latch 800 uses the same scan-mux 310 configuration as was used in the single-phase latch designs. The configuration and operation of the scan-mux 310 will not be repeated here for the sake of brevity.

The output of the scan-mux 310 is coupled to the input of a first transmission gate 830. The transmission gate 830 is implemented using a high threshold voltage (HVT) n-channel circuit 832 and an HVT p-channel circuit 834. The output of the first transmission gate 830 is electrically connected to the input of a master register 840 (MR).

The input of the master register 840 (MR) is electrically connected to the input of a MR inverter 848. The output of the MR inverter 848 is electrically connected to the output of the MR 840 and the gate of a MR p-channel circuit 844. The output of the MR inverter 848 is also electrically connected to the gate of a MR n-channel circuit 842. The source of the MR p-channel circuit 844 is electrically connected to a power supply line. The source of the MR n-channel circuit 842 is electrically connected to voltage common. The drain of the MR p-channel circuit 844 is electrically connected to the drain of a MR n-channel feedback circuit 846 and is also electrically connected back to the input of the MR inverter 848. The source of the MR n-channel feedback circuit 846 is electrically connected to the drain of the MR n-channel circuit 842.

The output of the master register 840 is electrically connected to a second transmission gate 850. The second transmission gate 850 is implemented using a low threshold voltage (LVT) n-channel circuit 852 and a LVT p-channel circuit 854. The output of the second transmission gate 850 is electrically connected to the input of a slave register 860.

The slave register 860 configuration is similar to the configuration of the slave register 360 used in the single-phase latch 300. The input of the slave register 860 (SR) is electrically connected to the SR output. The input is also electrically connected to the input of a SR inverter 868. The output of the SR inverter 868 is electrically connected to the gate of a SR p-channel circuit 864. The output of the SR inverter 868 is also electrically connected to the gate of a SR n-channel circuit 862. The source of the SR p-channel circuit 864 is electrically connected to a power supply line. The source of the SR n-channel circuit 862 is electrically connected to voltage common. The drain of the SR p-channel circuit 864 is electrically connected to the drain of a SR n-channel feedback circuit 866 and is also electrically connected back to the input of the SR 860. The source of the SR n-channel feedback circuit 866 is electrically connected to the drain of the SR n-channel circuit 862.

The output of the slave register 860 is electrically connected to an output buffer 875. A first inverter 872 has an input electrically connected to the input of the buffer 875. The output of the first inverter 872 is electrically connected to the input of a second inverting buffer 874. The output of the second inverting buffer 874 is the output of the two-phase latch 800. The two inverters, 872 and 874, preferably comprise LVT circuits. The first and second inverters, 872 and 874, use an n-channel footswitch 876 to electrically connect a virtual voltage common of the first and second inverters, 872 and 874, to an actual voltage common. The gate of the footswitch 876 is electrically connected to the inverted control input, designated "ssb", of the scan-mux 310. As noted earlier in the description of the single-phase latch 300, a footswitch may be preferable to a headswitch if a footswitch may be manufactured using a smaller circuit than a comparable headswitch. An additional HVT inverter 878 is implemented in parallel with the buffer to allow the two-phase latch 800 to provide an output during the scan, or test periods.

A first phase input phi1 for receiving a control signal having a first phase, also referred to as a first phase signal, is electrically connected to the gate of the n-channel circuit 832 of the first transmission gate 830. The first phase signal is also provided to the input of a first phase inverter 892. The output of the first phase inverter 892 is electrically connected to the gate of the p-channel circuit 834 of the first transmission gate 830 and to the MR n-channel feedback circuit 846. Thus, the first transmission gate 830 conducts when the first phase signal phi1 is at a high level and is cut off when the first phase signal is at a low level.

A second phase input for receiving a control signal having a second phase, also referred to as a second phase signal phi2, is electrically connected to the gate of the n-channel circuit 852 of the second transmission gate 850. The second phase signal is also provided to the input of a second phase inverter 894. The output of the second phase inverter 894 is electrically connected to the gate of the p-channel circuit 854 of the second transmission gate 850 and to the gate of the SR n-channel feedback circuit 866. Thus, the second transmission gate 850 conducts when the second phase signal is at a high level and is cut off when the second phase signal is at a low level.

The operation of the two-phase latch 800 may be described as follows. During an active, or non-sleep, period the control signal provided to the scan-mux 310 is at a low level. The scan-mux 310 selects the data on the d input and couples the selected data to the output of the scan-mux 310. The use of LVT circuits 322 and 324 in the d input signal path of the scan-mux 310 reduces the set-up time requirement of the two-phase latch 800.

The first transmission gate 830 conducts during the period of time that the first phase signal phi1 is at a high level. The output of the first transmission gate 830 is provided to the input of the master register 840. The MR n-channel feedback circuit 846 is cut off while the first phase signal is at a high level. The signal at the input of the master register 840 is inverted in the MR inverter 848 and is coupled to the second transmission gate 850.

It may be appreciated that the first and second transmission gates, 830 and 850, may be configured to operate on other phases of the phase signals by incorporating additional phase signal inverters or other signal processing. The actual phase of the control signal used by the latch does not limit the invention. Only one phase configuration is described for the sake of brevity. Thus, it may be appreciated that the latch 800 may be configured to use active low or active high circuits.

The first transmission gate 830 is cut off when the first phase signal transitions to a low level, and during the period of time that the first phase signal is at a low level. The MR n-channel feedback circuit 846 conducts during the time that the first transmission gate 830 is cut off. Thus, there is a feedback path from the output of the master register 840 to the input of the master register 840. The master register 840 latches the data during the period of time that the first transmission gate 830 is cut off.

The second transmission gate 850 conducts during the period of time that the second phase signal phi2 is at a high level. The signal at the output of the master register 840 is output from the two-phase latch 800 at the low to high transition of the second phase signal. The use of LVT circuits in the second transmission gate 850 reduces the clock-to-Q time of the two-phase latch 800. The use of LVT circuits in the buffer also reduces the clock-to-Q time of the latch 800.

The output of the second transmission gate 850 is provided to the input of the slave register 860. The SR n-channel feedback circuit 866 is cut off while the second phase signal is at a high level. The signal at the input of the slave register 860 is preferable buffered before being provide to the output of the two-phase latch 800.

The second transmission gate 850 is cut off when the second phase signal transitions to a low level, and during the period of time that the second phase signal is at a low level. The SR n-channel feedback circuit 866 conducts during the time that the second transmission gate 850 is cut off. Thus, the slave register 860 latches the data upon the falling edge of the second phase signal.

Operation of the two-phase latch 800 in the scan, or test, operation does not require high speed. Thus, the Sin input path of the scan-mux 310 does not implement any LVT circuits. It may be noted that the scan operation is used typically during test and verification and is not typically used during normal operation of the latch.

Figure 9:
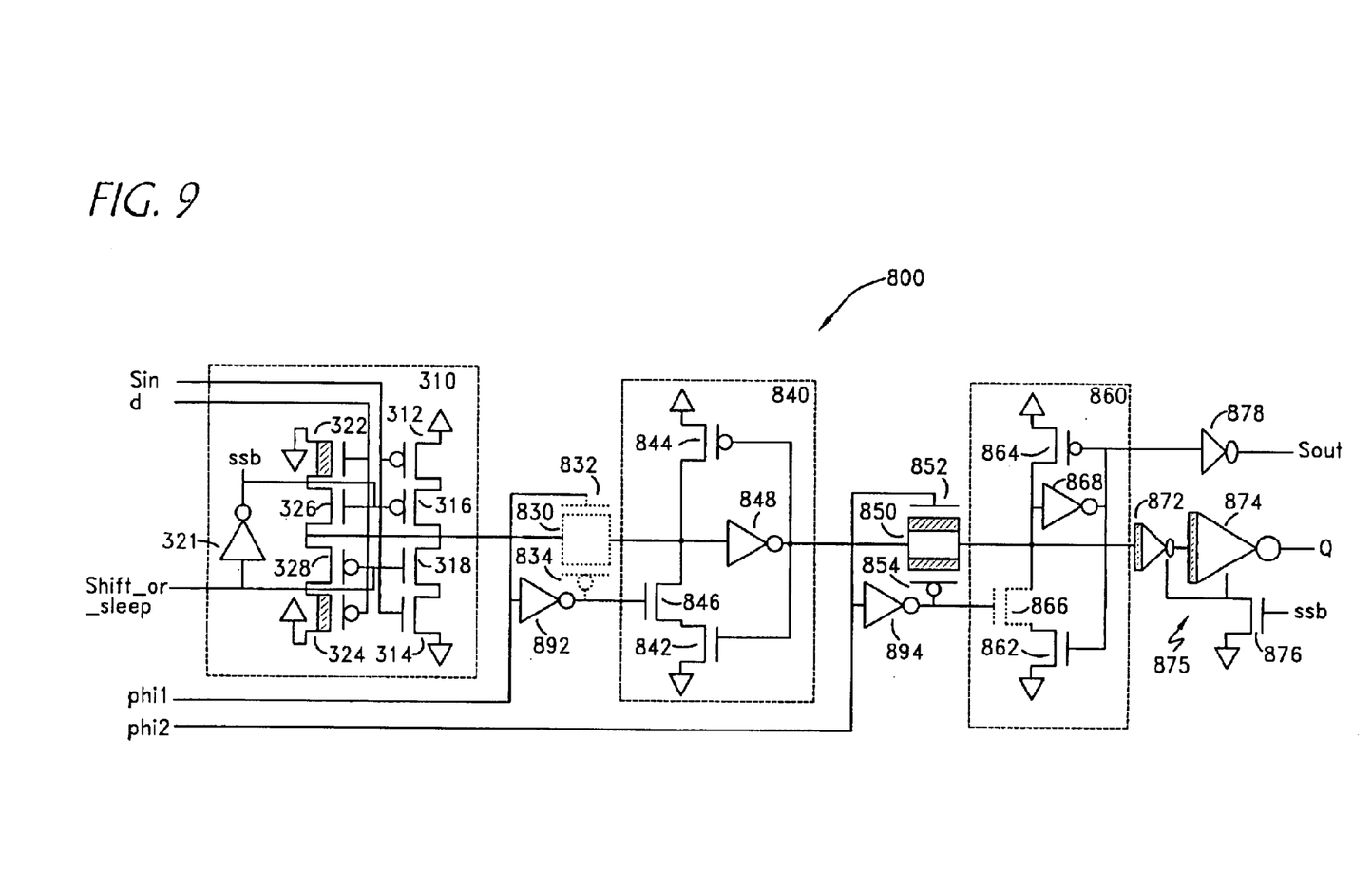
FIG. 9 is a block diagram of a two-phase MTCMOS latch during sleep mode with phi1 low.

The two-phase latch in the sleep mode is shown in FIG. 9. The sleep mode of the two-phase latch may be defined to occur when the Shift_or_sleep control signal is at a high level. The sleep mode may further be constrained to occur when the first phase signal is low and the second phase signal is high.

During the sleep mode of the two-phase latch, the data is stored in the master register 840. Thus, the data is not lost during the sleep mode and the circuit may resume operating from a previous state immediately upon return to the active mode.

Figure 10:
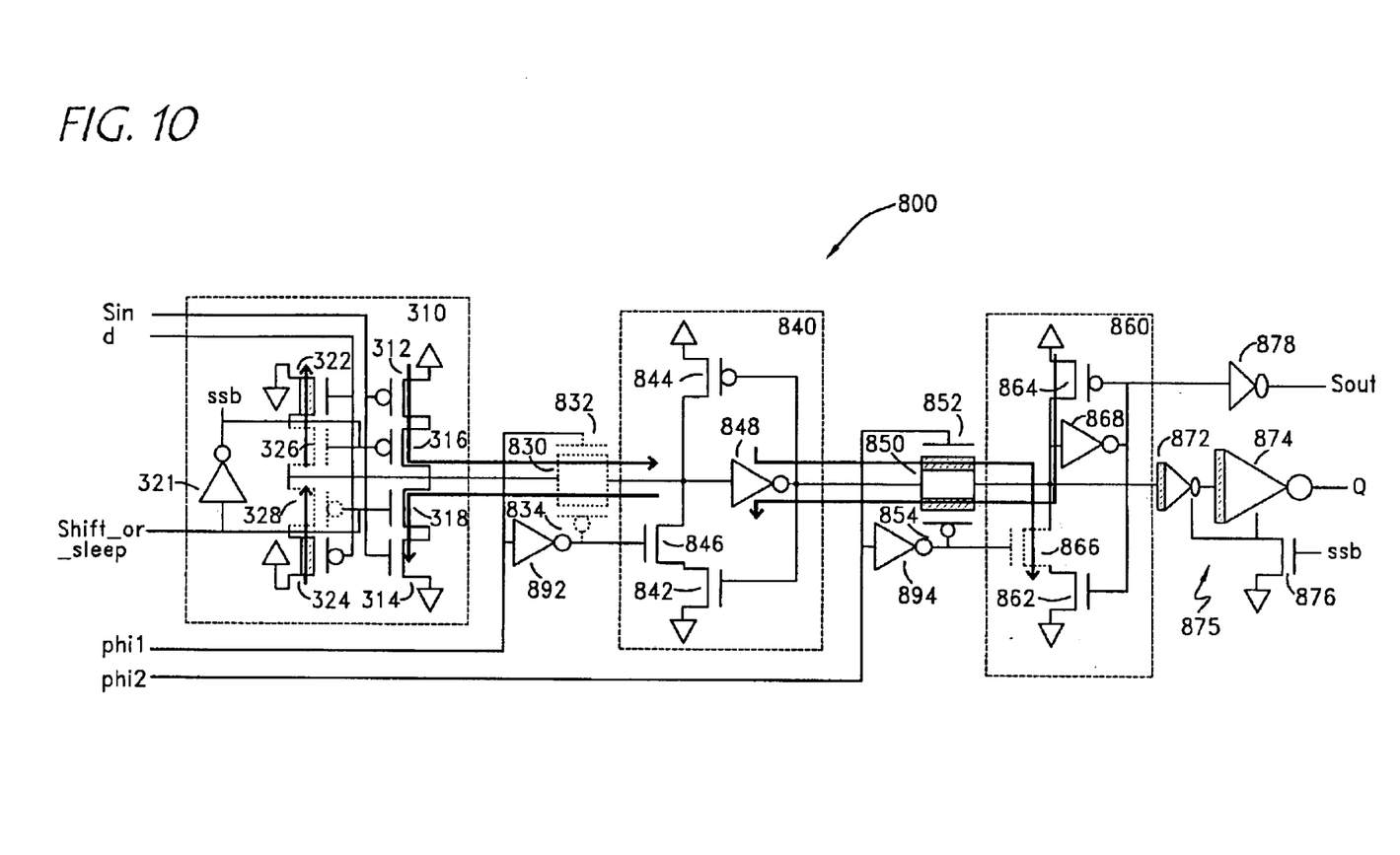
FIG. 10 is a block diagram of leakage paths of a two-phase MTCMOS latch during sleep mode with phi1 low.

The leakage current of the two-phase latch is limited by the placement of the HVT circuits in relation to the LVT circuits. The leakage paths of the two-phase latch 800 are shown in FIG. 10. Because the scan-mux 310 configuration in the two-phase latch 800 is identical to the configuration used in the single-phase latch design, the leakage paths through the scan-mux 310 are identical to those discussed earlier. The leakage through the LVT circuits, 322 and 324, used in the d input path of the scan-mux 310 are limited by the series configuration of the cut off HVT circuits, 326 and 328. The leakage through the Sin input through the output of the scan-mux 310 is limited by the use of low leakage HVT circuits, 832 and 834, in the first transmission gate 830. Note that the first transmission gate 830 is cut off in the sleep mode. The leakage from the output of the scan-mux 310 through the n-channel circuits, 318 and 314, is likewise limited by the cut off HVT circuits, 832 and 834, in the first transmission gate 830.

The leakage from the output of the master register 840 to voltage common is limited by the cut off HVT SR n-channel feedback circuit 866. A leakage path exists from the power supply line through the SR p-channel circuit 864 and second transmission gate 850 to voltage common via the output of the master register 840. Although all of the circuits are active in the sleep mode, it may be seen that virtually no leakage occurs through this path.

Taking first the condition where the output of the MR inverter 848 is a low level, it may be seen that the input of the SR inverter 868 is driven to a low level. Thus, the output of the SR inverter 868 is at a high level and the SR p-channel circuit 864 is cut off. Thus, the cut off SR p-channel circuit 864 limits the leakage through the output of the master latch 860 to voltage common.

Taking the second condition where the output of the MR inverter 848 is a high level, it may be seen that the input of the SR inverter 868 is driven to a high level. Thus, the output of the SR inverter is low and the SR p-channel circuit 864 conducts. Thus, the drain of the SR p-channel circuit, which is connected to the input of the SR inverter 868, is at a high level. This high level at the drain of the SR p-channel circuit 864 reinforces the already high level driven by the master register 840. Thus, there is no leakage in the sleep mode when the output of the master register 840 is at a high level.

The two-phase latch 800 may also be optimized for sleep mode occurring when the first phase signal is high and the second phase signal is low. In this sleep mode condition, the signal is stored in the slave register 860. The two-phase latch 800 is modified from that shown in FIG. 8 such that the first transmission gate 830 comprises LVT circuits and the second transmission gate 850 comprises HVT circuits.

In an alternative embodiment of the two-phase latch 800, sleep mode may occur when the first phase signal is high and the second phase signal is low. If the two-phase latch 800 is optimized for this sleep mode condition, the first transmission gate 830 is implemented using LVT circuits while the second transmission gate 850 is implemented using HVT circuits.

During the sleep mode of the two-phase latch 800 with the first phase signal high, the data is stored in the slave register 860. Thus, the data is not lost during the sleep mode and the circuit may resume operating from a previous state immediately upon return to the active mode.

The leakage current of the two-phase latch 800 is limited by the placement of the HVT circuits in relation to the LVT circuits. Leakage through the master register 840 is limited by the use of HVT circuits, while leakage current through the output buffer is limited by the HVT footswitch 876.

Thus, it may be appreciated that the judicious positioning of LVT circuits and HVT circuits in a two-phase latch 800 allows the latch design to have nearly the same high speed performance of a latch implemented entirely in LVT circuits while maintaining the low leakage current of a latch implemented entirely in HVT circuits. The LVT circuits are placed in the signal path while maintaining at least one HVT circuit in every leakage current path. The MTCMOS latches disclosed accomplish the performance/leakage optimization while maintaining the data in a non-volatile manner during the sleep period.

Positioning the LVT circuits in series with the signal path through the latch ensures the high speed performance and low delays associated with LVT designs. Placing HVT circuits, which are cut off in the sleep mode, in series with the leakage paths through the LVT circuits ensure a low leakage design. HVT circuits thus limit the leakage currents.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled persons may implement the described functionality in varying ways for each particular application, but such implementation decisions should not be interpreted as causing a departure from the scope of the invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC or as discrete components. The ASIC may reside in a mobile station, base station, or base station controller.

The above description of the disclosed embodiments is provided to enable any person skilled in the art to make or use the invention. Various modifications to these embodiments will be readily apparent to those skilled in the art, and the generic principles defined herein may be applied to other embodiments without departing from the scope of the invention. Thus, the invention is not intended to be limited to the embodiments shown herein but is to be accorded the widest scope consistent with the principles and novel features disclosed herein.

What is claimed is:

1. An integrated circuit (IC) including circuits configured to operate in an active mode and a sleep mode, wherein during the sleep mode the IC maintains a data bit, the IC comprising:
    a first transmission gate comprising an input and an output, the first transmission gate enabled in response to a first control signal;
    a master register (MR) comprising high threshold voltage (HVT) complementary metal oxide semiconductor (CMOS) circuits, a MR input, and a MR output, the MR input electrically connected to the output of the first transmission gate;
    a second transmission gate comprising an input and an output, the second transmission gate electrically connected to the MR output, the second transmission gate enabled in response to a second control signal; and
    a slave register (SR) having an input electrically connected to the output of the second transmission gate, the slave register comprising HVT CMOS circuits,
    wherein the first transmission gate comprises HVT CMOS circuits, the second transmission gate comprises LVT CMOS circuits, and during the sleep mode, the first transmission gate is disabled, the second transmission gate is enabled, and the data bit is stored in the master register.

2. The IC of claim 1, wherein the first control signal comprises a clock signal and the second control signal comprises a logical inverse of the clock signal.

3. The IC of claim 1, wherein the first transmission gate is enabled when the first control signal is active.

4. The IC of claim 1, wherein the second transmission gate is enabled when the second control signal is active.

5. The IC of claim 1, wherein, during a sleep mode, the first control signal is active, the second control signal is inactive, and the data bit is latched in the master register.

6. The IC of claim 1, further comprising a low threshold voltage CMOS buffer having an input electrically connected to the output of the slave register.

7. The IC of claim 6, further comprising a footswitch selectively disconnecting a virtual power return connection of the low threshold voltage CMOS buffer from an actual power return connection in response to a sleep signal.

8. The IC of claim 6, further comprising a high threshold voltage buffer having an input electrically connected to the output of the slave register.

9. The IC of claim 1, further comprising a multiplexer comprising:
    a first input adapted to receive a first signal;
    a second input adapted to receive a second signal; and
    a control input adapted to receive a control signal having a plurality of states;

wherein either the first or second input signal is selectively coupled to a multiplexer output in response to one of the plurality of states of the control signal, and wherein the multiplexer output is electrically connected to the input of the first transmission gate.

10. The IC of claim 9, wherein the multiplexer further comprises:
a low threshold voltage CMOS inverter having an input electrically connected to the first input and an output electrically connected to the multiplexer output; and
a CMOS switch for selectively activating the low threshold voltage CMOS inverter in response to the state of the control signal.

11. The IC of claim 1, wherein the IC is an Application Specific Integrated Circuit (ASIC).

12. The IC of claim 1, wherein the IC is a processor.

13. An integrated circuit (IC) including circuits configured to operate in an active mode and a sleep mode, wherein during the sleep mode the IC maintains a data bit, the IC comprising:
a first transmission gate comprising an input and an output, the first transmission gate enabled in response to a first control signal;
a master register (MR) comprises high threshold voltage (HVT) complementary metal oxide semiconductor (CMOS) circuits, a MR input, and a MR output, the MR input electrically connected to the output of the first transmission gate;
a second transmission gate comprising an input and an output, the second transmission gate electrically connected to the MR output, the second transmission gate enabled in response to a second control signal; and
a slave register (SR) having an input electrically connected to the output of the second transmission gate, the slave register comprising HVT CMOS circuits,
wherein the first transmission gate comprises LVT CMOS circuits, the second transmission gate comprises HVT CMOS circuits, and during the sleep mode, the first transmission gate is enabled, the second transmission gate is disabled, and the data bit is stored in the slave register.

14. The IC of claim 13, wherein, during a sleep mode, the first control signal is inactive, the second control signal is active, and the data bit is stored in the slave register.

15. An electronic device, configured to operate in an active mode and a sleep mode, the electronic device comprising:
a multiplexer having a plurality of signal inputs and a multiplexer control input, wherein a first signal input is electrically connected to the gates of a first low threshold voltage n-channel circuit and a low threshold voltage p-channel circuit;
a first transmission gate electrically connected to an output of the multiplexer, the first transmission gate enabled in response to a first control signal;
a master register comprising high threshold voltage (HVT) complementary metal oxide semiconductor (CMOS) circuits having an input electrically connected to an output of the first transmission gate;
a second transmission gate electrically connected to an output of the master register, the second transmission gate enabled in response to a second control signal; and
a slave register having an input electrically connected to an output of the second transmission gate, the slave register comprising HVT MOS circuits.

16. The electronic device of claim 15, wherein, during the sleep mode, the first control signal is at a high level, the second control signal is at a low level, and a data bit is stored in the master register.

17. The electronic device of claim 15, wherein, during the sleep mode, the first control signal is at a low level, the second control signal is at a high level, and a data bit is stored in the slave register.

18. The electronic device of claim 15, further comprising an output buffer having an input electrically connected to an output of the slave register.

19. The electronic device of claim 15, wherein the electronic device comprises a telephone.

20. The electronic device of claim 15, wherein the electronic device comprises a paging device.

21. A method of storing a data bit, the method comprising:
providing a first signal path through a first low threshold voltage (LVT) CMOS circuit;
providing first high voltage threshold (HVT) circuits in series with the first low threshold CMOS circuit;
coupling an output from the first signal path to a master register using a first transmission gate;
latching the data bit in the master register in response to a first phase signal;
coupling an output of the master register to a slave register using a second transmission gate;
storing the data bit in the master register in response to a sleep signal, the first transmission gate comprising HVT circuits and the second transmission gate comprising LVT circuits; and
storing the data bit in the slave register in response to a second phase signal, wherein the first and second phase signals are not the same signal.

22. The method of claim 21, further comprising coupling an output buffer to an output of the slave register.

23. A method of storing a data bit, the method comprising:
providing a first signal path through a first low threshold voltage (LVT) CMOS circuit;
providing a first high voltage threshold (HVT) circuit in series with the first low threshold CMOS circuit;
coupling an output from the first signal path to a master register using a first transmission gate;
latching the data bit in the master register in response to a first phase signal;
coupling an output of the master register to a slave register using a second transmission gate;
storing the data bit in the slave register in response to a sleep signal, the first transmission gate comprising LVT circuits and the second transmission gate comprising HVT circuits.

24. An IC comprising:
means for coupling one of a plurality of input signals to a first switching means, wherein the means for coupling comprises low threshold voltage (LVT) circuits in series with high threshold (HVT) circuits, and wherein the first switching means is enabled in response to a first phase signal;
a first means for storing a data input signal, the first means for storing electrically connected to an output of the first switching means; and
a second switching means for coupling an output of the first means for storing to an input of a second means for storing, the second switching means being enabled in response to a second phase signal,
wherein the first switching means comprises LVT circuits and the second switching means comprises LVT circuits.

* * * * *